United States Patent [19]

Shideler et al.

[11] 4,435,225

[45] Mar. 6, 1984

[54] METHOD OF FORMING SELF-ALIGNED LATERAL BIPOLAR TRANSISTOR

[75] Inventors: Jay A. Shideler, San Mateo; Robert L. Berry, Cupertino, both of Calif.

[73] Assignee: Fairchild Camera & Instrument Corporation, Mountain View, Calif.

[21] Appl. No.: 262,568

[22] Filed: May 11, 1981

[51] Int. Cl.³ .............. H01L 29/72; H01L 21/225; H01L 21/22
[52] U.S. Cl. .................. 148/1.5; 29/576 B; 148/187; 357/34; 357/91
[58] Field of Search .......... 148/1.5, 187; 357/34, 357/91; 29/576 B

[56] References Cited

U.S. PATENT DOCUMENTS

| | | | |
|---|---|---|---|
| 3,648,125 | 3/1972 | Peltzer | 317/235 |
| 3,873,989 | 3/1975 | Schinella et al. | 357/35 |
| 3,919,005 | 11/1975 | Schinella et al. | 148/175 |
| 3,945,857 | 3/1976 | Schinella et al. | 148/1.5 |
| 3,962,717 | 6/1976 | O'Brien | 357/44 |
| 3,993,513 | 11/1976 | O'Brien | 148/175 |
| 4,066,473 | 1/1978 | O'Brien | 148/1.5 |
| 4,110,779 | 8/1978 | Rathbone et al. | 148/1.5 |
| 4,143,455 | 3/1979 | Schwabe et al. | 148/1.5 |
| 4,148,054 | 4/1979 | Hart et al. | 148/1.5 |
| 4,168,999 | 9/1979 | Vora et al. | 148/175 |
| 4,191,595 | 3/1980 | Aomura et al. | 148/1.5 |
| 4,261,763 | 4/1981 | Kumar et al. | 148/1.5 |
| 4,283,236 | 8/1981 | Sirsi | 148/187 |
| 4,298,402 | 11/1981 | Hingarh | 148/1.5 |
| 4,357,622 | 11/1982 | Magdo et al. | 357/44 |

OTHER PUBLICATIONS

Projected Range Statistics, 2nd Edition, Ed. Gibbons et al., DHR, Stroudsburg, Pa, 1975.
Peltzer, 1972 Wescon Tech. Papers, Sep. 1972, pp. 1–4.
Stephen, Proc. Int. Microelectronics Conf., Anaheim, Calif., Feb. 1975, pp. 88–97.

*Primary Examiner*—Upendra Roy
*Attorney, Agent, or Firm*—Kenneth Olsen; Carl L. Silverman; Ronald C. Fish

[57] ABSTRACT

A lateral bipolar transistor having a base width of 0.5 micron or less is made by forming a protective layer on an electrically insulating layer along a surface of a semiconductor body, forming an open space through the protective layer so as to define a guiding edge for it, introducing a first semiconductor dopant of a selected conductivity type into the body using the guiding edge to control the lateral extent of the first dopant, etching the insulating layer back under the protective layer a selected distance from the guiding edge, oxidizing material of the body exposed by the open space in the protective and insulating layers to form a composite electrically insulating region, removing the remainder of the protective layer, etching the insulating region sufficiently long to create an open space through it and thereby define another guiding edge, and introducing a second semiconductor dopant of the selected conductivity type into the body using this second guiding edge to control the lateral extent of the second dopant toward the first dopant and thereby to control the resulting base width.

20 Claims, 31 Drawing Figures

FIG. 3ℓ

METHOD OF FORMING SELF-ALIGNED LATERAL BIPOLAR TRANSISTOR

BACKGROUND OF THE INVENTION

1. Field of the Invention

This invention relates generally to semiconductors and especially to self-aligned lateral bipolar transistors of narrow base width and methods for manufacturing such transistors, particularly in integrated circuit structures containing vertical bipolar transistors of opposite polarity.

2. Description of the Prior Art

Lateral bipolar transistors are of substantial importance in semiconductor devices. Unlike vertical bipolar transistors in which base width can be accurately regulated by controlling vertical diffusions, lateral transistors pose greater difficulties in producing bases which are sufficiently narrow to achieve high gain and whose dimensions are accurately controllable and reproducible.

Within the prior art, R. Schinella et al. disclose the structure and method for making a lateral transistor using two diffusions through a single mask opening in U.S. Pat. No. 3,873,989, "Double-Diffused, Lateral Transistor Structure," U.S. Pat. No. 3,919,005, "Method for Fabricating Double-Diffused, Lateral Transistor," and U.S. Pat. No. 3,945,857, "Method for Fabricating Double-Diffused, Lateral Transistors." A lateral transistor made according to the foregoing patents typically has a minimum base width of approximately 0.5 to 1 micron with an impurity gradient in the horizontal direction across the base; this impurity gradient is undersirable in some applications.

D. O'Brien discloses a method for fabricating a singly-diffused lateral transistor in U.S. Pat. No. 4,066,473, "Method of Fabricating High-Gain Transistors." The base width of the lateral transistor manufactured according to this O'Brien patent is typically 1-3 microns using current masking technology. There is substantially no horizontal impurity gradient across the base.

Bipolar transistors of both the lateral and vertical type often utilize oxide-isolation techniques such as those disclosed by D. Peltzer in U.S. Pat. No. 3,648,125, "Method of Fabricating Integrated Circuits with Oxidized Isolation and the Resulting Structure," to demarcate the active semiconductor regions. Such oxide-isolation techniques are further described by Peltzer in "Isoplanar Processing," 1972 *Wescon Technical Papers,* presented at Western Electronic Show and Convention, Sept. 19-22, 1972, Session 19, Section 19/2, pages 1–4. D. O'Brien discloses the use of an anti-inversion region with oxide isolation for making complementary lateral and vertical transistors in U.S. Pat. No. 3,962,717, "Oxide Isolated Integrated Injection Logic with Selective Guard Ring," and U.S. Pat. No. 3,993,513, "Combined Method for Fabricating Oxide-Isolated Vertical Bipolar Transistors and Complementary Oxide-Isolated Lateral Bipolar Transistors and the Resulting Structures."

In fabricating integrated circuit structures such as those having complementary lateral and vertical bipolar transistors, many of the semiconductor regions may be formed by ion implantation techniques. One of the perennial problems in ion implantation is the prevention of ions in the ion beam from entering semiconductor regions where implantation is not desired. J. Stephen in "The Contribution of Ion Implantation to Silicon Device Technology," Proceedings of the Technical Program, International Microelectronics Conference, Anaheim, Calif. Feb. 11-13 and June 17-19 1975, pages 88-97, suggests that silicon nitride might be used as a mask to prevent undesired ion implantation in semiconductor circuits.

SUMMARY OF THE INVENTION

In accordance with the invention, a self-aligned lateral bipolar transistor having a base width normally of 0.5 micron or less is manufactured in a semiconductor body such as an epitaxial layer on the substrate of a silicon semiconductor wafer or simply such as substrate itself. The semiconductor body contains an impurity region of a first conductivity type adjacent to an electrically insulating layer, typically of a semiconductor oxide, along the upper surface of the body. Part of the impurity region ultimately serves as the base for the lateral transistor.

A protective layer, preferably of silicon nitride, is formed over the insulating layer. A portion of the protective layer is then removed to form an open space above a location in the foundation intended for a first doped region of a second conductivity type opposite to the first conductivity type. This location is at least partially coincident with a part of the impurity region. Spaced laterally apart in the body from this location is another location intended similarly for a second doped region of the second conductivity type and likewise at least partially coincident with another part of the impurity region. The edge of the protective layer created by the open space nearest to this other location acts as a guide to define the base width of the lateral transistor. Part of the first doped region ultimately serves, for example, as a collector for the lateral transistor, while the second doped region ultimately serves, for example, as an emitter.

A semiconductor dopant of the second conductivity type is introduced into the semiconductor body to form the first doped region. This dopant may be ion implanted through the hole in the protective layer using its guiding edge to control the lateral extent of the implant. The remainder of the protective layer prevents the dopant from being introduced elsewhere into the body. In subsequent high temperature steps, the dopant may diffuse laterally as well as vertically to define the ultimate location of the first doped region.

The insulating layer is etched through the open space in the protective layer to extend the open space through the insulating layer. This etching extends back under the protective layer from its guiding edge laterally toward the location intended for the second doped region. By using a suitable wet chemical etchant, the rate of etchback is substantially constant and the distance of the etchback under the protective layer is accurately determined as a linear function of the etching time. The remainder of the protective layer prevents the insulating layer from being etched elsewhere. Alternatively, when ion implanting, at least part of this etching may be perfomed prior to introduction of the dopant into the semiconductor body for forming the first doped region.

The semiconductor material underlying the insulating layer is exposed to an appropriate oxidizing environment through the open space in the protective layer and insulating layers. This causes the exposed adjacent portions of the first doped region and the impurity region outside the first doped region to oxidize and form a composite electrically insulating region of which the insulating layer is a part. The remainder of the protective layer acts to prevent further oxidation away from the vicinity of the open space. Accordingly, the composite insulating region has a minimum thickness above the intended location for the second doped region. The extent to which the newly oxidized material encroaches laterally toward this intended location is a direct function of the etchback distance under the protective layer.

At least a portion of the remainder of the protective layer above the intended location for the second doped region is removed down to the insulating region. Preferably, the entire remainder of the protective layer is etched away. An open space is formed through the insulating region where its thickness is a minimum above the intended location for the second doped region. Preferably, the insulating region is etched for a sufficient time to create this open space without etching through the insulating region anywhere else. This produces a guiding edge of the insulating region nearest to the remainder of the first doped region—that is, the remaining non-oxidized portion of the first doped region. The location of this guiding edge preferably coincides generally with the end point of the oxidation encroachment toward the intended location for the second doped region.

A semiconductor dopant of the second conductivity type is introduced into the semiconductor body through the opening in the insulation region to create the second doped region. Preferably, the dopant is diffused into the body using the guiding edge of the insulating region to control the lateral extent of the second doped region toward the first doped region.

The base of the lateral bipolar tansistor then comprises the remainder of the impurity region—that is, the remaining non-oxidized portion of the impurity region. The emitter is either the second doped region or the remainder of the first doped region. The collector is the other of the second doped region and the remainder of the first doped region.

The location of the two guiding edges relative to each other is a function of the lateral oxide encroachment under the protective layer during the oxidation step and consequently a function of the etchback distance. As a result, the base width is a function of the etchback distance and the subsequent conditions for forming the emitter and collector. If these subsequent conditions are held constant, the base width is substantially a linear function of etchback time.

The lateral transistor of the invention may be either NPN type or PNP type. Other P-type and/or N-type regions and other devices such as a complementary vertical transistor may be formed near or partially coincident with the lateral transistor. Furthermore, the fabrication procedure described herein may be employed in fabricating other types of devices having a pair of doped regions of like conductivity type separated from each other.

A significant advantage of the invention is that a well-defined base width is formed that is narrower than base width of transistors manufactured in the prior art. Whereas prior art methods often require two photoresist masking edges to establish base width, only a single photoresist masking edge is required to form the two guiding edges of the present lateral transistor and accordingly its base width. By use of only a single masking edge, the lateral transistor is self-aligning.

Another advantage is that there is substantially no impurity variation in the lateral direction across the base as a whole and, in particular, across the portion of the base forming the base width. The resultant transistor transit time is less than 1 nanosecond.

A further advantage of the invention is that the etching during the etchback substantially reduces the severity of the "bird beaks" of oxide-isolation regions when isoplanar technology is used for defining the active areas of the semiconductor foundation. As a consequence, the metal coverage for electrical conductors is superior to that in the prior art.

BRIEF DESCRIPTION OF THE DRAWINGS

FIGS. 3l, 3m, 3o, and 3s are expanded cross-sectional views of parts of FIGS. 1l, 1m, 1o, and 1s, respectively.

Like reference symbols are employed in the drawings to represent the same item or items in the drawings and in the description of the preferred embodiments.

DESCRIPTION OF THE PREFERRED EMBODIMENTS

In the following description, boron is generally used as the P-type impurity (or dopant) for creating the various regions of P-type conductivity in or on a semiconductor wafer. Antimony and phosphorous are employed selectively as the complementary N-type impurities for creating the N-type regions. Other appropriate impurities may be utilized in place of the foregoing dopants.

Conventional photomasking, cleaning, and annealing techniques, which are well known in the prior art, are employed in fabricating a lateral bipolar transistor and a complementary vertical bipolar transistor. Accordingly, no references are made to the steps involved in creating and removing a mask of photoresist or to the cleaning and annealing steps.

Directional adjectives such as "upper," "lower," "top," and "bottom" are used solely for describing the invention with respect to a semiconductor wafer lying flat and substantially parallel to the ground as viewed from the side. "Lateral" or "horizontal" refers to a direction generally along a direction parallel to the plane in which (the substantially flat bottom surface of) the wafer lies, while "vertical" refers to a direction generally orthogonal to the plane of the wafer.

Figure 1A:
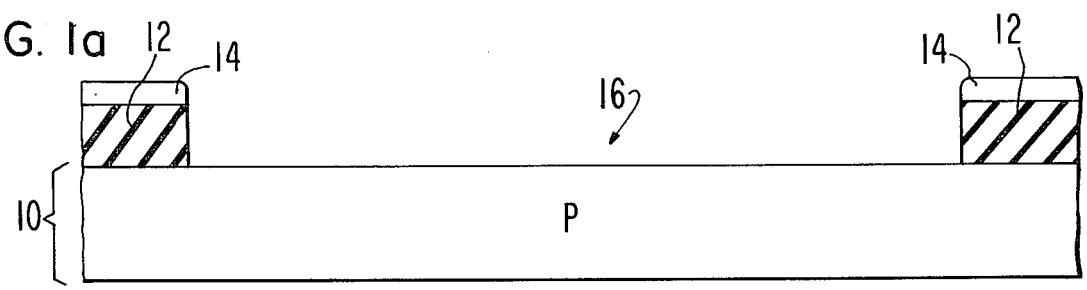
FIGS. 1a–1v and 1k' are cross-sectional views of a semiconductor wafer illustrating steps for fabricating a lateral bipolar transistor and a complementary vertical bipolar transistor.
Figure 1B:
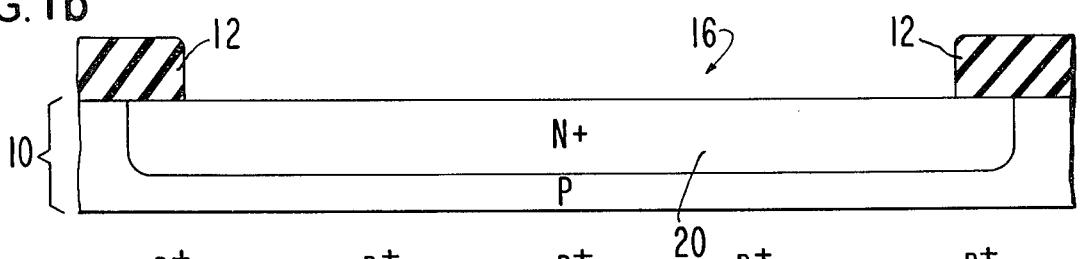
Figure 1C:
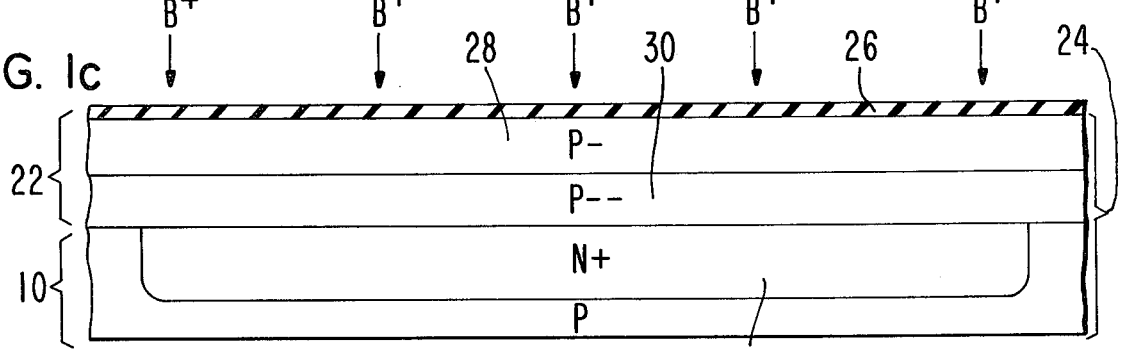
Figure 1D:
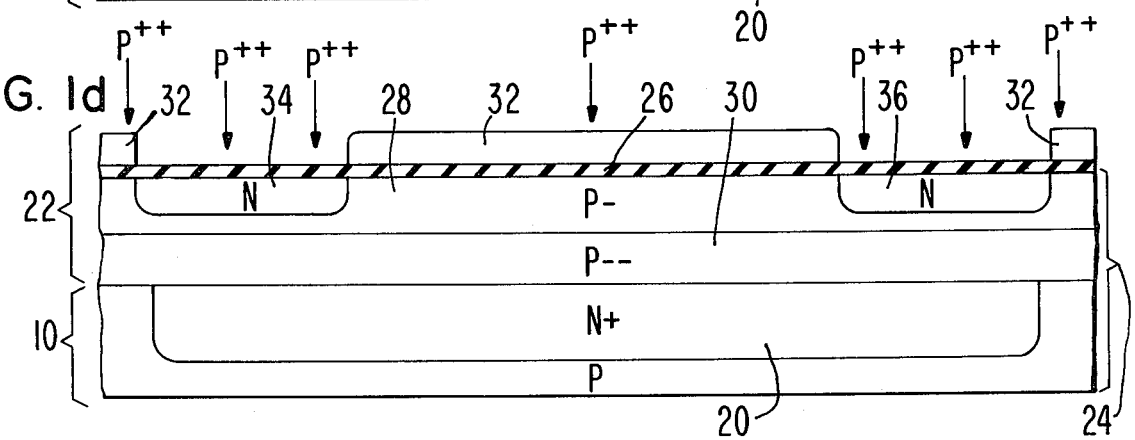
Figure 1E:
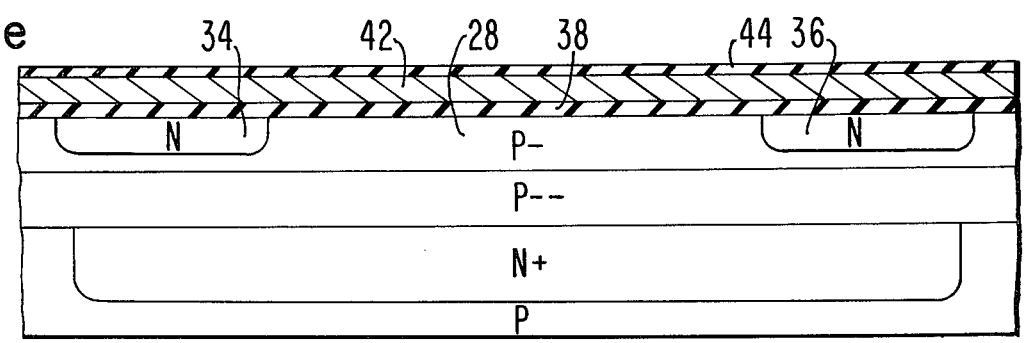
Figure 1F:
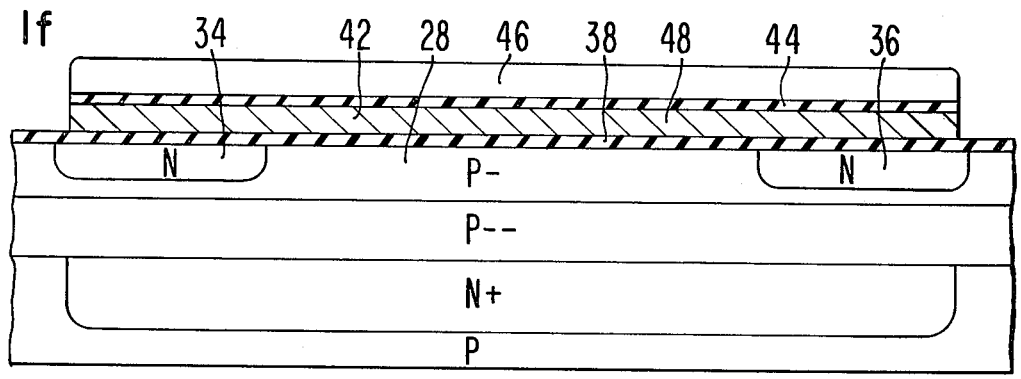
Figure 1G:
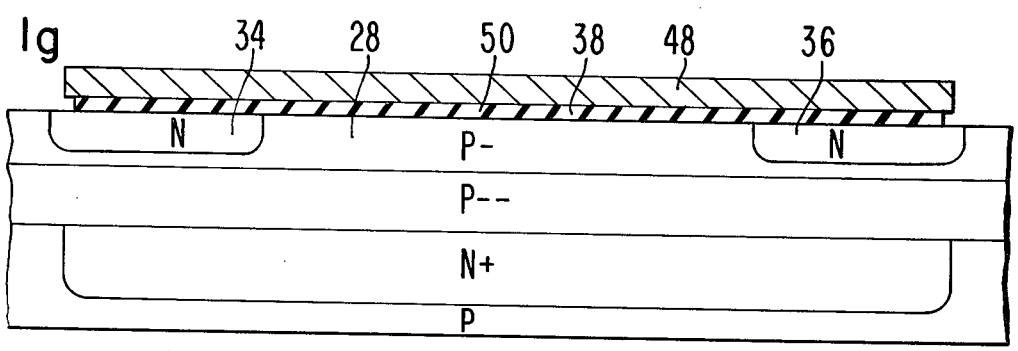
Figure 1H:
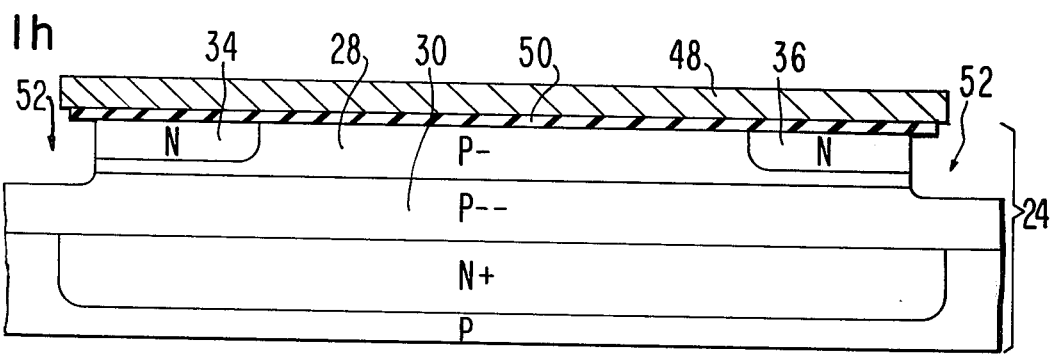
Figure 1I:
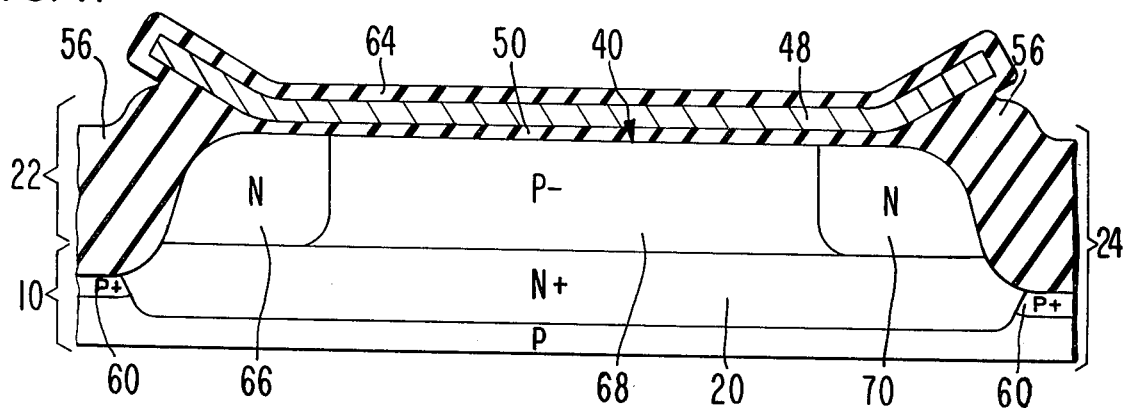
Figure 1J:
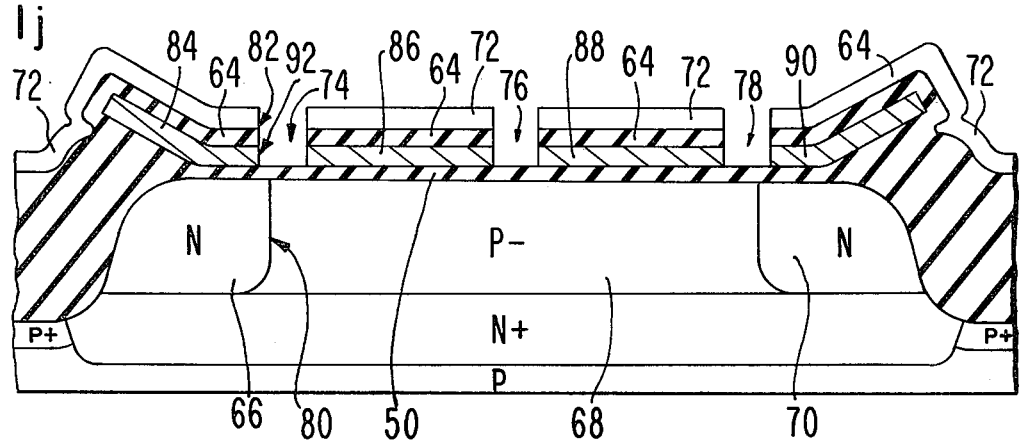
Figure 1K:
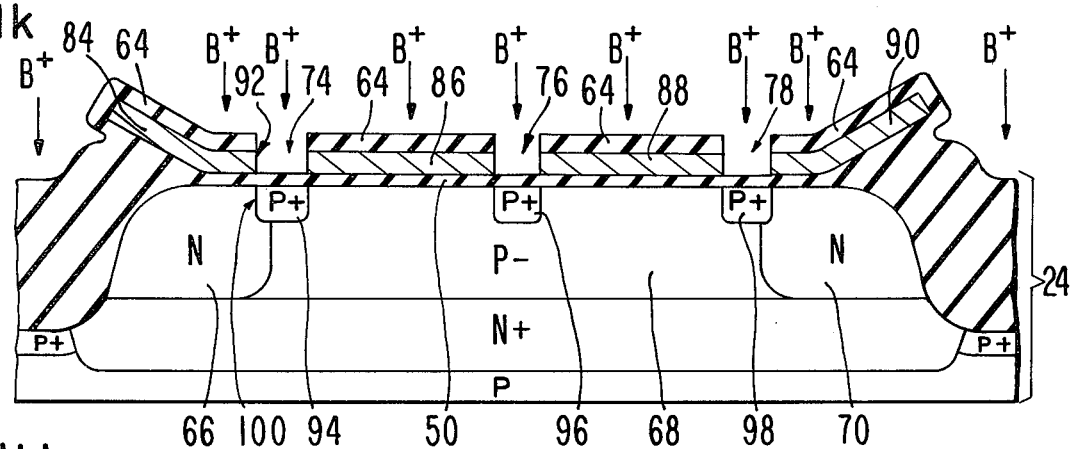
Figure 1K:
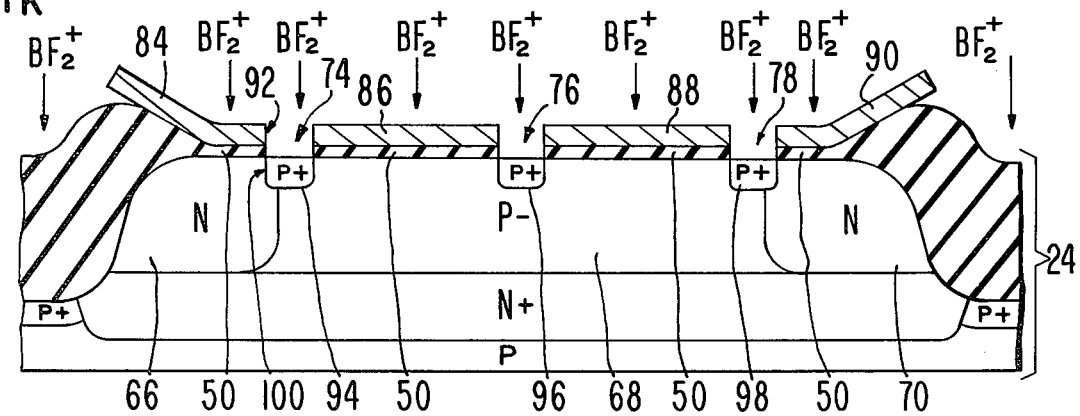
Figure 1L:
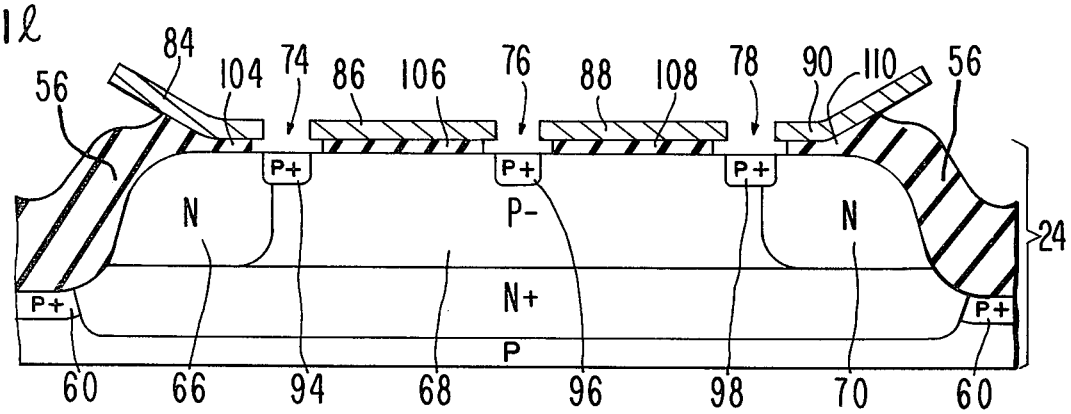
Figure 1M:
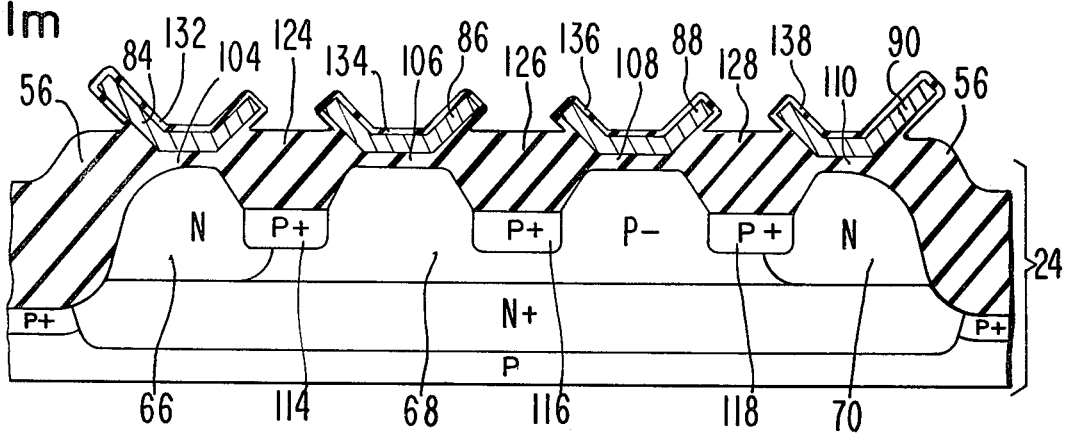
Figure 1N:
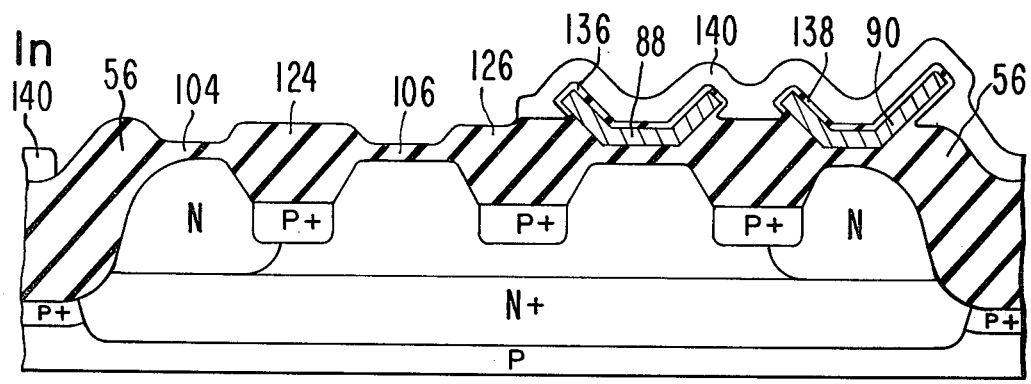
Figure 1O:
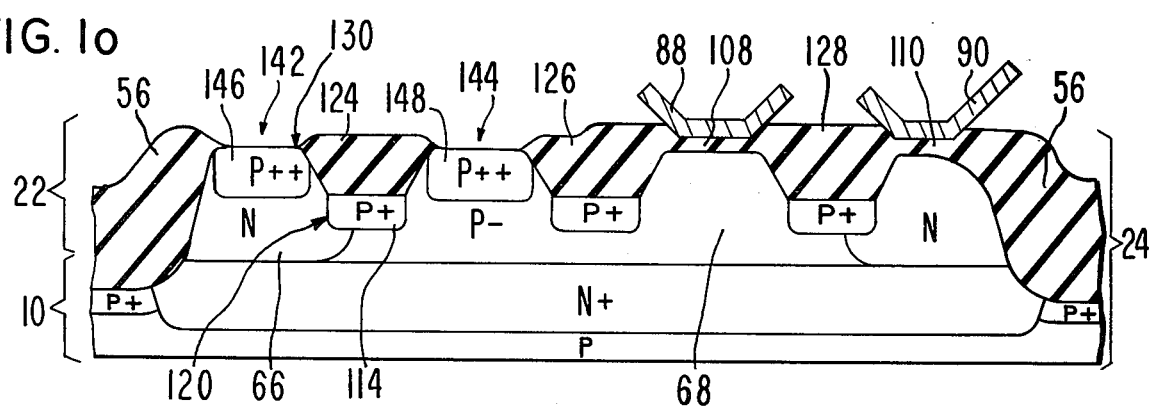
Figure 1P:
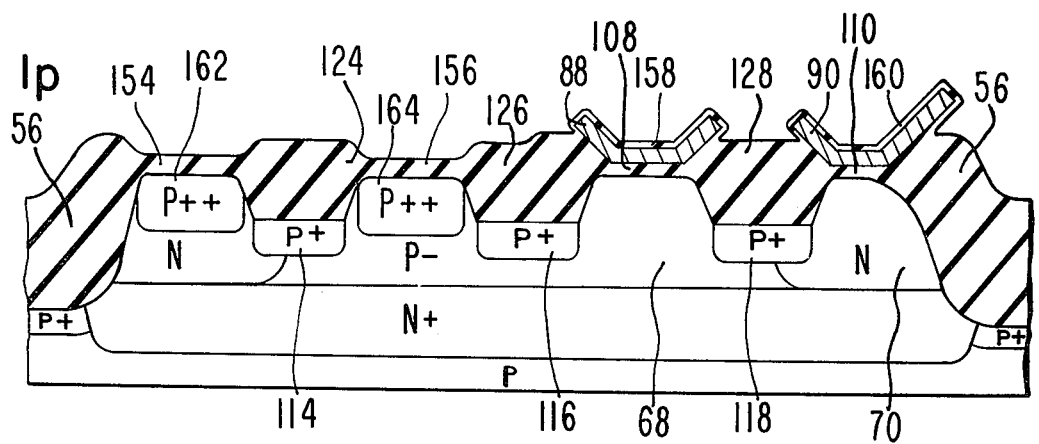
Figure 1Q:
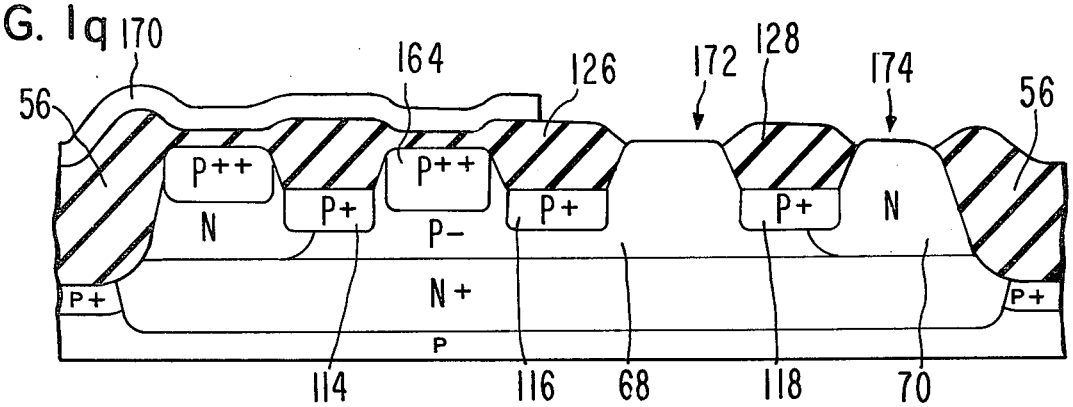
Figure 1R:
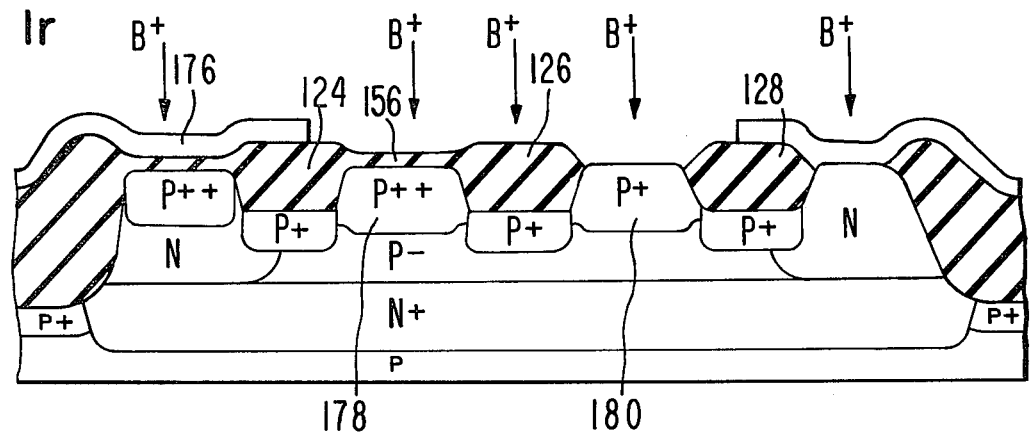
Figure 1S:
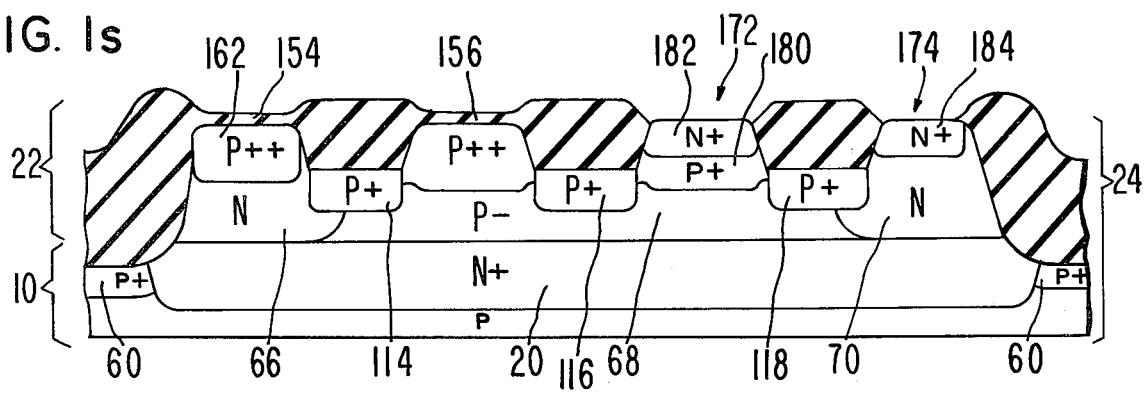
Figure 1T:
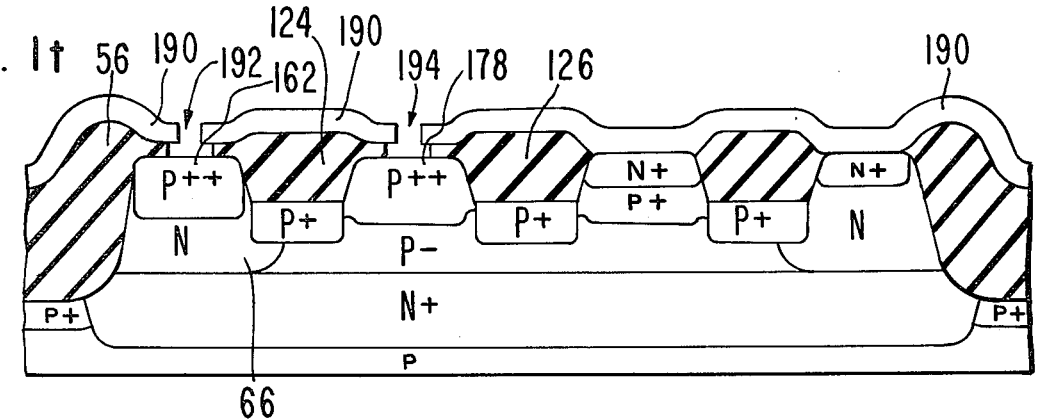
Figure 1U:
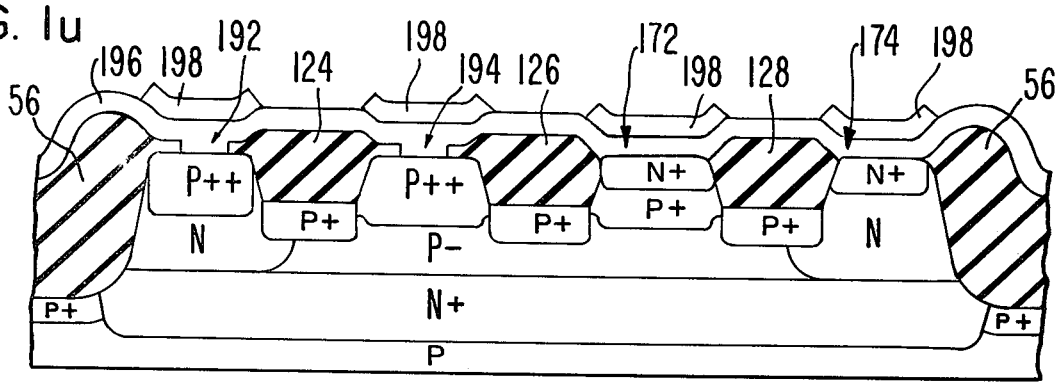
Figure 1V:
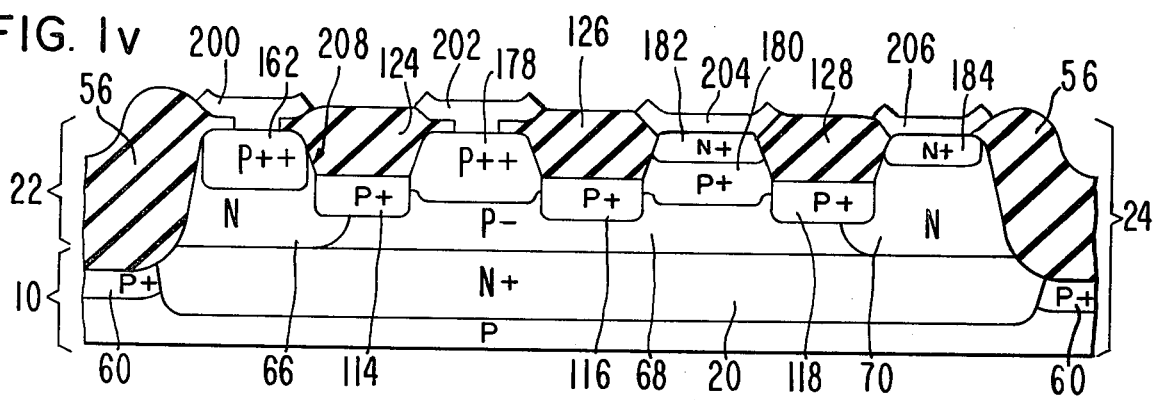

Referring to the drawings, FIGS. 1a–1v and 1k' illustrate steps in manufacturing the lateral and vertical transistors using a substrate 10 of a semiconductor wafer. Substrate 10 is P-type monocrystalline silicon having a resistivity of 1–3 ohm-centimeters. Initially, an electrically insulating layer 12 of silicon dioxide is on the top surface of substrate 10 as shown in FIG. 1a. Oxide layer 12 has a thickness of approximately 8,000 angstroms.

A photoresist mask 14 is formed on the top surface of oxide layer 12. A hole 16 is etched through oxide layer 12 by exposing it through an opening in mask 14 for about 10 minutes (which equals the time needed to clear the exposed silicon dioxide plus about 1 minute) to a buffered etchant consisting of 1 part of electronic-grade hydrofluoric acid (49 weight percent HF) and 6 parts of a solution of 40 weight percent ammonium fluoride in water (hereinafter "buffered hydrofluoric acid"). The buffered hydrofluoric acid substantially does not attack the underlying (doped) silicon.

After removing mask 14, an N-type impurity, antimony from an $Sb_2O_3$ source, is diffused into the portion of substrate 10 exposed by hole 16 at a temperature of 1,240° C. to form buried N+ region 20 as depicted in FIG. 1b. N+ region 20 has a sheet resistance of approximately 30–35 ohms/square and a depth (or thickness) of about 25,000 angstroms. (The wafer is then exposed to dry oxygen for 15 minutes at a temperature of 1240° C. to grow a layer of silicon dioxide about 1000 angstroms in thickness at the portion of the wafer surface exposed by hole 16. Inasmuch as the depression of about 500 angstroms depth remaining after removal of this oxide layer is only employed for mask registration, neither this oxide layer nor this depression are illustrated in the drawings.) The remaining portions of oxide layer 12 (as well as the oxide layer in hole 16 at the wafer surface) are stripped away by submerging the wafer in electronic-grade hydrofluoric acid.

A P— — epitaxial layer 22 of P-type silicon is grown from dicholorosilane according to conventional techniques on the top surface of substrate 10 including over N+ region 20 as shown in FIG. 1c. Epitaxial layer 22 has a thickness of 14,000–16,000 angstroms and a resistivity greater than 10 ohm-centimeters. In combination, substrate 10 and epitaxial layer 22 constitute a composite body 24 of semiconductor material. The top surface of epitaxial layer 22 is oxidized by exposing it for 10 minutes to dry oxygen at a temperature of 1,000° C. to grow an electrically insulating layer 26 of silicon dioxide having a thickness of 200–400 angstroms. Oxide layer 26 serves to protect substrate 10 from contamination during subsequent ion implantations.

A P-type dopant, boron in the form of B+, is ion implanted through insulation layer 26 into epitaxial layer 22 at a dosage of $2 \times 10^{12}$ ions/centimeter$^2$ at an energy level of 200 kiloelectron volts to create a P— layer 28. The direction of implantation is generally orthogonal to the plane of the wafer—i.e., no more than 7 degrees from the vertical. The sheet resistance of P— layer 28 is about 9000 ohms/square. The remaining portion of epitaxial layer 22 is illustrated as P— — layer 30.

As illustrated in FIG. 1d, a photoresist mask 32 is formed on the top surface of oxide layer 26. An N-type dopant, phosphorus in the form of P++, is implanted through the portions of oxide layer 26 exposed by a pair of open regions in mask 32 at a dosage of $5 \times 10^{13}$ ions/centimeter$^2$ at an energy level of 400 kiloelectron volts to form N regions 34 and 36 spaced apart from each other in P— layer 28 generally above N+ region 20. Again, the direction of implantation is generally orthogonal to the plane of the wafer—i.e., 7 degrees off vertical at most. N regions 34 and 36 have a sheet resistance of about 130–140 ohms/square. Alternatively, regions 34 and 36 may be created by implanting phosphorous in the form of P+.

After stripping away mask 32, oxide layer 26 is etched away by submerging the wafer for 30 seconds in buffered hydrofluoric acid. The top surface of P— layer 28 is oxidized by exposing it to dry oxygen for 10 minutes at 1,000° C. to create a new protective electrically insulating layer 38 of silicon dioxide as depicted in FIG. 1e. Insulation layer 38 has a thickness of 200–400 angstroms.

A protective electrically insulating layer 42 of silicon nitride ($Si_3N_4$) is deposited on the top surface of oxide layer 38. Nitride layer 42 has a thickness of 1,500–1,800 angstroms. The top surface of nitride layer 42 is oxidized by exposing it to steam at a temperature of 1,000° C. for 60 minutes to form a protective electrically insulating layer 44 of silicon dioxide having a thickness of approximately 50 angstroms.

As shown in FIG. 1f, a photoresist mask 46 is formed on the top surface of oxide layer 44. Mask 46 overlies portions of N regions 34 and 36 as well as the portion of P— region 28 between N regions 34 and 36. The portions of insulation layer 44 not protected by mask 46 are removed by etching for 1 minute with buffered hydrofluoric acid. The underlying portions of silicon-nitride layer 42 are removed by etching with boiling electronic-grade phosphoric acid (85–86 weight percent $H_3PO_4$)(hereafter "boiling phosphoric acid") for approximately 60 minutes. Item 48 indicates the portion of nitride layer 42 remaining after these steps.

After removing mask 46, the top surface of the wafer is exposed for 1 minute to buffered hydrofluoric acid. The buffered hydrofluoric acid substantially does not attack silicon nitride. As a consequence, the portions of oxide layer 38 not overlaid by nitride layer 48 are etched away as illustrated in FIG. 1g. Item 50 indicates the remaining portion of oxide layer 38. The remaining portion of oxide layer 44 overlying nitride layer 48 is also removed during this step.

Next, an annular groove 52 is formed below the areas where oxide layer 38 has been removed by exposing the top surface of the wafer to an iodine buffered etchant formed in the proportions of 27.5 grams of iodine, 5,000 milliliters of electronic-grade acetic acid (99.7 weight percent $CH_3COOH$), 200 milliliters of electronic-grade hydrofluoric acid, and 2,500 milliliters of electronic-grade nitric acid (69–71 weight percent $HNO_3$). Groove 52 extends all the way through P— layer 28 and partially into P— — layer 30 as depicted in FIG. 1h. Groove 52 also extends back under nitride layer 48 and into parts of N regions 34 and 36.

According to techniques described in U.S. Pat. No. 3,962,717, cited above and specifically incorporated by reference herein, a P-type impurity, boron from a $BBr_3$ source, is deposited on the surface area forming groove 52 and then driven to a shallow depth into the wafer material adjacent to groove 52 by a predeposition process to form a P+ antiinversion guard ring around groove 52.

As illustrated in FIG. 1i, an annular electrically insulating oxide-isolation region 56 is formed in groove 52 according to techniques generally described in U.S. Pat. No. 3,648,125, cited above and specifically incorporated by reference herein. In particular, the silicon adjacent to groove 52 is oxidized by exposing it at a temperature of 1,000° C. in dry oxygen for 90 minutes and then in steam for 720 minutes.

During this oxide-isolation process, the anti-inversion guard ring diffuses downward and sideward ahead of the advancing silicon/silicon-dioxide interface where silicon is being converted into oxide region 56. P+ anti-inversion region 60 is the remaining portion of the anti-inversion guard ring. In forming oxide-isolation region 56, the ends of nitride layer 48 bend upward away from substrate 10 as silicon dioxide grows under the end portions of nitride layer 48. The top of oxide region 56 is in the shape of a "bird beak" with the tip of the bird beak occurring approximately where the ends of nitride layer 48 bend upward. The oxide-isolation process also causes the top surface of nitride layer 48 to oxidize forming an electrically insulating layer 64 of silicon dioxide which extends over the ends of layer 48 to join with oxide-isolation region 56. Oxide layer 64 has a thickness of about 500–1000 angstroms. The thickness of nitride layer 48 decreases slightly as a consequence of the formation of oxide layer 64.

The implanted impurities in silicon regions 34, 28, and 36 diffuse generally downward toward N+ region 20 during the oxide-isolation process. As a consequence, N region 34, P− region 28, and N region 36 become N region 66, P− region 68, and N region 70, respectively, which share their lower boundaries with the upper boundary of buried N+ region 20. Since the ion implantations generally follow a Gaussian distribution as a function of depth into the doped silicon, part of the impurities implanted in original N regions 34 and 36 also diffuse upward to reduce the impurity gradient substantially in the vertical direction. The net dopant concentration in N regions 66 and 70 is about $4 \times 10^{17}$ ions/centimeter$^3$, and the net dopant concentration in P− region 68 is about $2 \times 10^{16}$ ions/centimeter$^3$.

A photoresist mask 72 having holes 74, 76, and 78 is formed on the top surface of the wafer as illustrated in FIG. 1j. Hole 74 overlies adjacent portions of N region 66 and P− region 68—i.e., hole 74 overlies the right-hand boundary 80 of N region 66 and extends to the right from the right-hand edge 82 of mask 72. Likewise, hole 78 overlies adjacent portions of regions 68 and 70. Hole 76 overlies region 68 between holes 74 and 78.

The portions of oxide layer 64 exposed by holes 74, 76, and 78 are removed by the etching with buffered hydrofluoric acid for 1 minute. Next, holes 74, 76 and 78 are extended downward through silicon-nitride layer 48 by etching with boiling phosphoric acid for 60 minutes. This leaves silicon-nitride regions 84, 86, 88 and 90 as the remaining portions of nitride layer 48 where region 84 generally lies above N region 66. The well-defined righthand edge 92 of nitride region 84 is generally vertically aligned with masking edge 82.

After removing mask 72, a P-type dopant, boron in the form of B+, is ion implanted preferably at a dosage of $6 \times 10^{14}$ ions/centimeter$^2$ at an energy of 27 kiloelectron volts through the portions of oxide layer 50 exposed by holes 74, 76, and 78 into the underlying silicon to form P+ regions 94, 96, and 98 as shown in FIG. 1k. P+ region 94 occupies adjacent portions of N region 66 and P− region 68. Likewise P+ region 98 occupies adjacent portions of regions 68 and 70. P+ regions 96 consists solely of a portion of region 68. P+ regions 94, 96, and 98 each have a sheet resistance of about 200 ohms/square.

Silicon-nitride regions 84, 86, 88, and 90 in combination with oxide layer 50 and the remaining portions of oxide layer 64 act as protective covering to prevent implantation of the singly ionized (or charged) boron into the doped silicon underlying nitride regions 84, 86, 88 and 90. Accordingly, except for a small calculable lateral scattering deviation (which is about 500 angstroms here) and a small off-angle deviation (normally less than 100 angstroms) caused by implanting B+ *ions at a direction no greater than* 7 degrees from the vertical, the left-hand and right-hand boundaries (or edges) or P+ regions 94, 96, and 98 are all substantially aligned with the corresponding well-defined end edges of nitride regions 84, 86, 88 and 90. In particular, right-hand edge 92 of nitride region 84 is substantially in vertical alignment with the left-hand boundary 100 of P+ region 94.

Figure 2A:
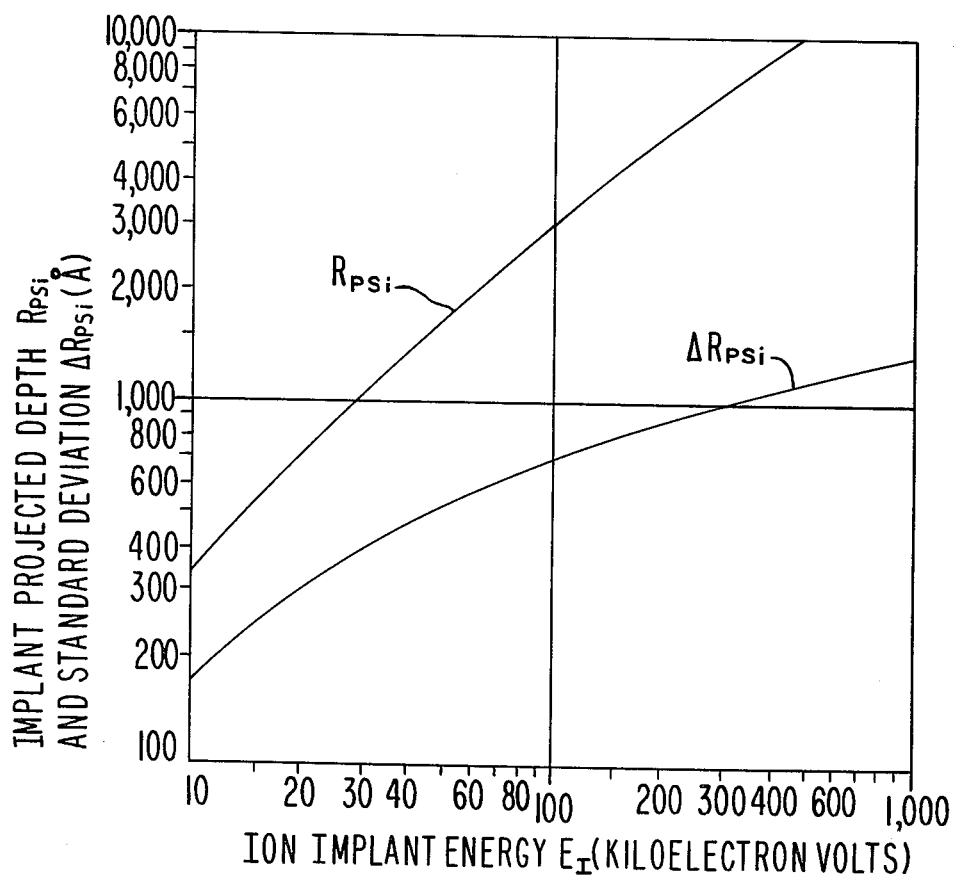
FIGS. 2a–2c are a silicon implant depth graph, an expanded cross-sectional view of a part of FIG. 1k, and a corresponding concentration profile, respectively, useful in understanding the ion-implantation protecting capability of silicon nitride.
Figure 2C:
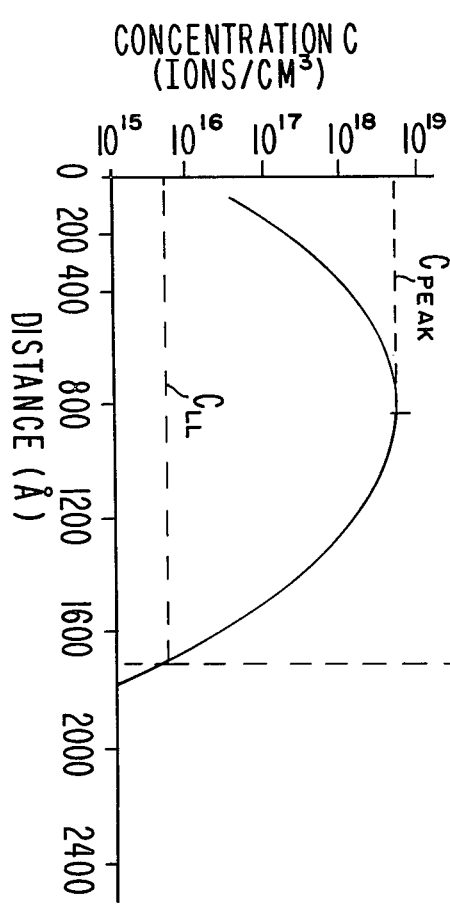
Figure 2B:
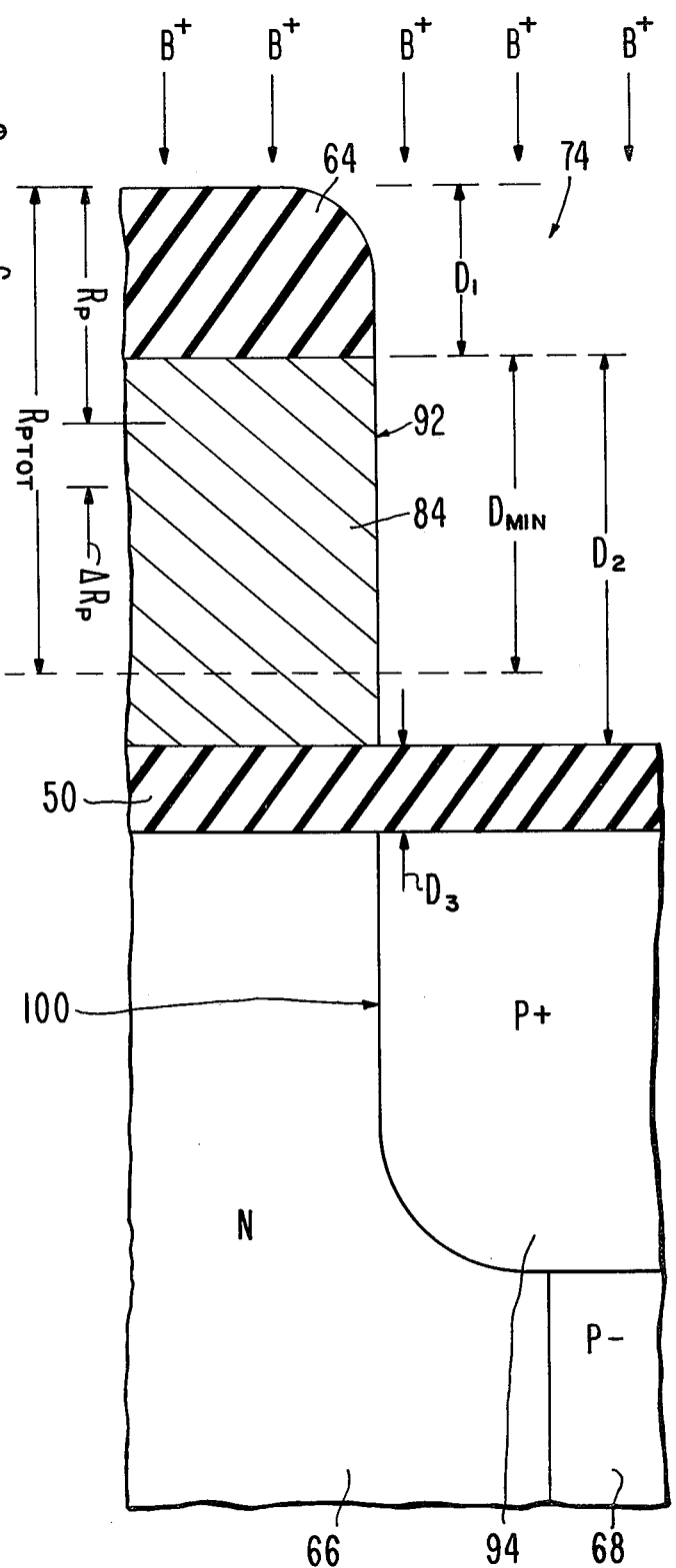

The ability of nitride regions 84, 86, 88, and 90 to act as protective covering for stopping impinging B+ ions and thereby preventing them from entering protected silicon regions is demonstrated with the assistance of FIGS. 2a, 2b, and 2c.

Referring to FIG. 2a which is derived from Gibbons et al., "Projected Range Statistics" (2d ed., Halstead Press), 1975, it illustrates projected implanted depth (or range) $R_{PSi}$ for B+ ions into silicon as a function of implant energy $E_I$. Implant depth $R_{PSi}$ represents the point at which the B+ ions in silicon are at the maximum implant concentration. The distribution of B+ ions in silicon is Gaussian to a first-order approximation in the vicinity of the maximum implant concentration and is represented in FIG. 2a by standard deviation $\Delta R_{PSi}$ measured in the direction of implant depth $R_{PSi}$. For semiconductor applications such as the present one, implant energy $E_I$ is normally in the range of 10–400 kiloelectron volts.

Silicon is defined to have a "stopping power" of 1.00 (unity) for B+ ions impinging at given implant energy $E_I$. The stopping powers of silicon nitride and silicon dioxide for B+ ions impinging at energy $E_I$ are defined relative to the stopping power of silicon. On this scale, silicon nitride has a stopping power $f_{SN}$ of about 1.25. That is, B+ ions impinging at energy $E_I$ penetrate only about $1/f_{SN}$ (about four-fifths) as far into silicon nitride as into silicon. Silicon dioxide has a stopping power of $f_{OX}$ of about 1.02. Consequently, silicon nitride has nearly 25 percent more stopping power than silicon dioxide.

Turning to FIG. 2b, it shows an expanded view of a part of FIG. 1k centering around hole 74, oxide layer 64, and nitride region 84. The vertical distances in FIG. 2b are drawn to a relative scale closely corresponding to the vertical distances given above and represented by the distance scale of FIG. 2c. FIG. 2c depicts a profile for the concentration C of B+ ions impinging on oxide layer 64 and entering nitride region 84 as a function of the vertical distance (or depth) from the top surface of oxide layer 64.

As shown in FIG. 2c, the distribution of B+ ions in silicon-nitride region 84 is Gaussian to a first-order approximation. The peak concentration $C_{PEAK}$ of B+ions in nitride region 84 is about $5 \times 10^{19}$ ions/centimeter$^2$ and occurs at implant depth $R_P$ (which extends across the thickness $D_1$ of oxide layer 64). Implant depth $R_P$ is given approximately by $$R_P = D_1 + \frac{(R_{PSi} - f_{OX} D_1)}{f_{SN}} \qquad (1)$$

where silicon implant depth $R_{PSi}$ is determined as a function of energy $E_I$ from FIG. 2a.

Beyond implant depth $R_P$, the concentration C drops to a lower level $C_{LL}$ at an effective total implant depth $R_{PTOT}$ beyond which any additional B+ ions have negligible effect. This establishes the minimum thickness $D_{MIN}$ needed for nitride region 84. Adequate protection from B+ ions is normally provided when concentration $C_{LL}$ is about a thousandth (or less) of concentration $C_{PEAK}$. Total implant depth $R_{PTOT}$ is determined from $$R_{PTOT} = R_p + a\Delta R_p = R_p + \frac{a\Delta R_{PSi}}{f_{SN}} \qquad (2)$$

where $\Delta R_p$ is the standard deviation of B+ ions in silicon nitride, $a$ is a proportionality constant given approximately as $\sqrt{2} \ln (C_{PEAK}/C_{LL})$ and equal to 3.74 at a concentration ratio $C_{PEAK}/C_{LL}$ of $10^3$, and standard deviation $\Delta R_{PSi}$ is determined as a function of implant energy $E_I$ from FIG. 2a.

Since the total thickness of oxide layer 64 and nitride region 84 exceeds total implant depth $R_{PTOT}$, the thickness $D_2$ of nitride region 84 (or region 86, 88, or 90) thereby exceeds minimum thickness $D_{MIN}$ given by $$D_{MIN} = \frac{R_{PSi} + a\Delta R_{PSi} - f_{OX}D_1}{f_{SN}} \qquad (3)$$

If oxide layer 64 either is removed or is not formed in the first place, the term involving thickness $D_1$ drops out of Eq. (3) and thickness $D_{Min}$ increases accordingly. For the embodiment described above, thickness $D_2$ exceeds thickness $D_{MIN}$ by about 250 angstroms.

Oxide layer 50 also provides protection against undesired B+ implantation. The thickness $D_3$ of insulation layer 50 may likewise be taken into account in Eq. (3).

Eqs. (1)–(3) apply generally to the implantation of ions other than B+ ions. In this case, $R_{PSi}$ and $\Delta R_{PSi}$ are the projected implant depth and corresponding standard deviation, respectively, for the particular ionic species in silicon. Likewise, $f_{SN}$ and $f_{OX}$ are the stopping powers of silicon nitride and silicon dioxide, respectively, for the particular ionic species relative to the stopping power of silicon.

In another embodiment as shown in FIG. 1k', the portions of oxide layer 50 exposed through holes 74, 76, and 78 are removed by submerging the wafer in buffered hydrofluoric acid for 1 minute after mask 72 is removed but before forming P+ regions 94, 96, and 98. The remaining portions of oxide layer 64 are also removed during this etching step. Holes 74, 76, and 78 then extend down to the upper surface of the underlying silicon. P+ regions 94, 96, and 98 are then formed by implanting boron in the form of BF$_2$+ (singly ionized boron difluoride produced from boron trifluoride) through holes 74, 76, and 78, respectively. Nitride regions 84, 86, 88, and 90 again act as a shield to prevent BF$_2$+ implantation into other portions of the wafer below oxide layer 50. The implant dosage is again $6\times10^{14}$ ions/centimeter$^2$, but the implant energy is about 50–70 kiloelectron volts principally to account for the higher molecular weight of BF$_2$+ compared to B+.

In contrast to B+ ions which do not detrimentally alter the structure of silicon nitride so as to destroy its resistance to etchants such as buffered hydrofluoric acid, BF$_2$+ ions do substantially alter the etching resistance of silicon nitride. Subsequent etching with buffered hydrofluoric acid after BF$_2$+ implanting normally removes a layer of silicon nitride having a thickness on the order of a BF$_2$+ implant depth. Implanting with BF$_2$+, however, offers the advantages of utilizing the ion implanting device in a mode which allows much higher dosage rates and a more easily controllable ion beam than with B+. The problem of silicon-nitride degradation through BF$_2$+ implantation may be alleviated by appropriately increasing the thickness of nitride regions 84, 86, 88, and 90 to allow for subsequent etching(s).

In another alternative, a layer of PVX (vapor deposited silicon dioxide containing about 6 weight percent phosphorous) may be deposited on oxide layer 64 prior to formation of mask 72 so as to provide additional boron implantation protection. This, however, necessitates more processing steps.

In still another alternative, P+ regions 94, 96, and 98 are formed using the structure generally shown in FIG. 1k' by predepositing boron from a BBr$_3$ source or another boron-based dopant gas through holes 74, 76, and 78 to a shallow depth into the underlying doped silicon rather than by implanting BF$_2$+. Since boron also diffuses laterally during this predeposition, left-hand boundary 100 is slightly further to the left of the location shown in FIG. 1k' but is still accurately determinable. This alternative has the advantage of not causing irreparable lattice damage which may occur with a boron implant at a dosage ranging from $10^{14}$–$10^{16}$ ions/centimeter$^2$.

At this point, attention is called to FIGS. 3l, 3m, 3o, and 3s which depict expanded views of parts of FIGS. 1l, 1m, 1o, and 1s, respectively, centering around regions 66, 84, and 94 and hole 74 to assist further in understanding the steps illustrated by FIGS. 1l–1s.

Where B+ ions have been implanted to form P+ regions 94, 96, and 98 in accordance with the procedure described for FIG. 1k, the wafer is submerged in buffered hydrofluoric acid at an etchant temperature $T_{ET}$ of 21° C. for a calculated etching time $t_{ET}$ in the range of 7–10 minutes to etch oxide layer 50 through holes 74, 76, and 78. This etching of oxide layer 50 extends back under nitride regions 84, 86, 88, and 90 as shown in FIG. 1l. Etchant temperature $T_{ET}$ is controlled to better than $\pm 0.5°$ C. since etching rate is a strong function of temperature $T_{ET}$. The distances of the etchbacks under nitride regions 84, 86, 88, and 90 are precisely regulated by controlling etching time $t_{ET}$. The remaining portions of oxide layer 50 are indicated as oxide portions 104, 106, 108, and 110. Nitride regions 84, 86, 88, and 90 act as protective covering to prevent further etching of insulation portions 104, 106, 108, and 110, respectively, from above.

As shown in FIG. 3l, this etching extends back a distance (or width) $W_{ETBK}$ from right-hand edge 92 of nitride region 84 to the right-hand edge 112 of oxide portion 104.

Figure 4:
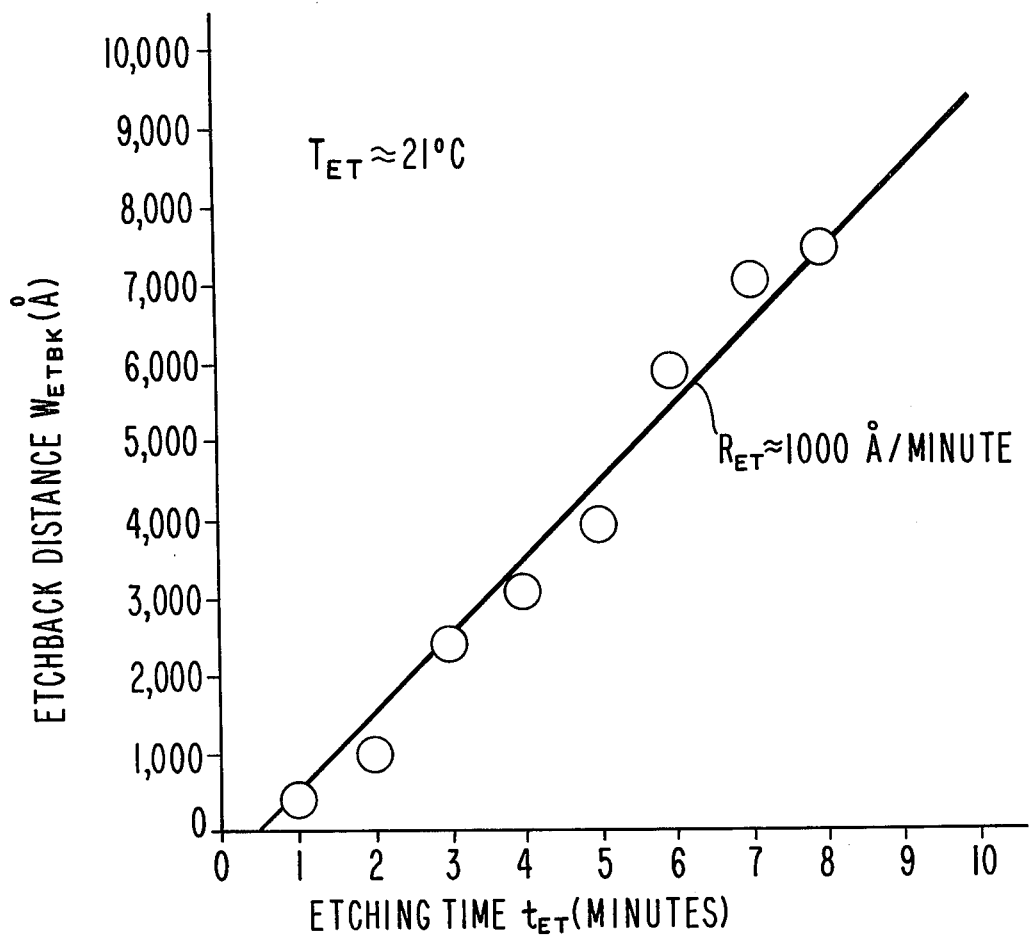
FIG. 4 is a graph for etchback distance as a function of time.

Etchback distance $W_{ETBK}$ substantially increases linearly with etching time $t_{ET}$ at constant etchant temperature $T_{ET}$. Referring to FIG. 4, it shows experimental data taken for etchback distance $W_{ETBK}$ at different etching times $t_{ET}$ for buffered hydrofluoric acid. After a short initial time (around 20–40 seconds) during which the buffered hydrofluoric acid etches down to the surface of the underying silicon, distance $W_{ETBK}$ subsequently increases nearly linearly with time $t_{ET}$. The etching rate $R_{ET}$, as shown by the straight line through the experimental data, is about 1000 angstroms/minute. This linear relationship holds at least up to an aspect ratio $W_{ETBK}/D_3$ of about forty.

If any of the embodiments involving the implantation of BF$_2$+ to form P+ regions 94, 96, and 98 is employed, etching time $t_{ET}$ is reduced about 1 minute since the portions of oxide layer 50 directly below holes 74, 76, and 78 have already been removed. The resulting structure is again that shown in FIGS. 1*l* and 3*l*. Likewise etching time t$_{ET}$ is reduced about 1 minute if P+ regions 94, 96, and 98 are formed by boron predeposition.

The hydrofluoric acid during this etching step also acts on the upper surfaces of oxide-isolation region 56 to substantially decrease the severity of the bird beak.

The wafer (in any of the embodiments) is now exposed at a temperature of 1,000° C. to dry oxygen for 30 minutes and then to steam for 120 minutes to drive the P-type impurity in P+ regions 94, 96, and 98 downward and sideward further into the adjacent doped silicon to create P+ regions 114, 116, and 118, respectively, as shown in FIG. 1*m*. Nitrogen may be used instead of dry oxygen in this step at the risk of some undesired boron autodoping (out diffusion) into N region 66. Each of P+ regions 114, 116, and 118 has a sheet resistance of about 6000 ohms/square.

Figure 3M:
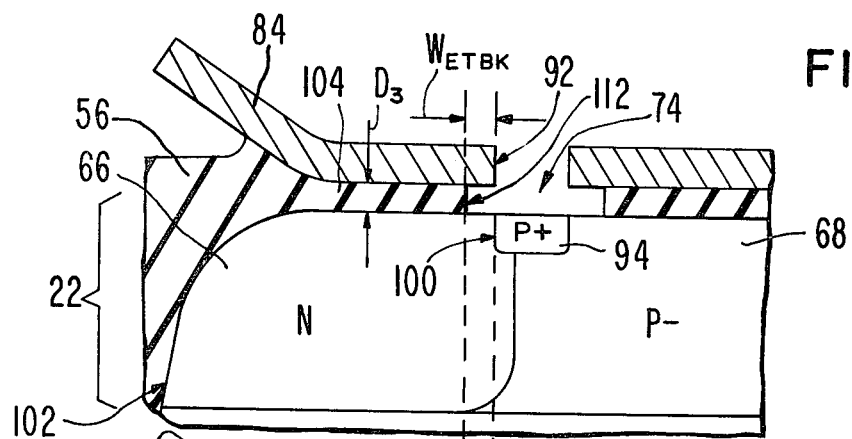
Figure 3M:
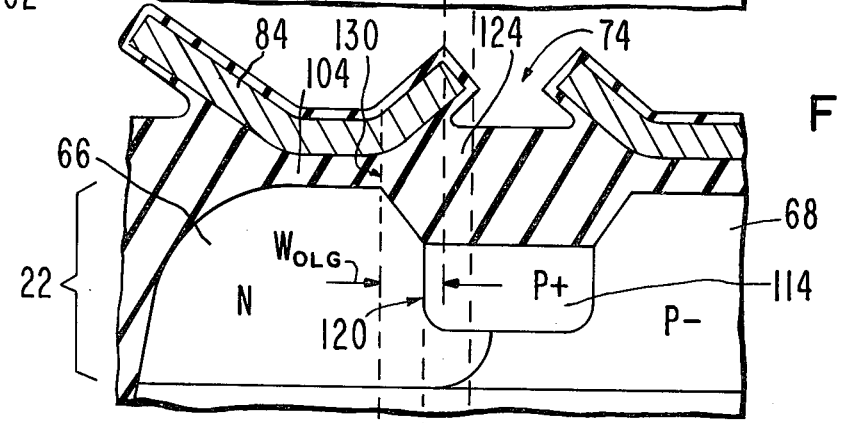

Referring to FIGS. 3*l* and 3*m*, the lateral diffusion of the P-type impurity from P+ region 94 is represented as a distance (or width) W$_{CLD}$ from left-hand side 100 of original P+ region 94 to the new left-hand boundary 120 of P+ region 114.

This step of subjecting the wafer to high-temperature steam causes the portions of the doped silicon exposed through holes 74, 76, and 78 to oxidize and form electrically insulating regions 124, 126, and 128, respectively, of silicon dioxide as shown in FIG. 1*m*. In particular, insulation region 124 grows from N region 66, P+ region 94, and P− region 68 and subsequently consists of adjacent oxidized portions of N region 66 and P+ region 114 and an oxidized portion of P− region 68. Similarly, insulation region 128 grows from N region 70, P+ region 98, and P− region 68. Insulation region 126 grows from P+ region 96 and P− region 68. The thickness (or depth) of oxide regions 124, 126, and 128 is about 4,000 angstroms. Each of oxide regions 124, 126, and 128 has left-hand and right-hand edges or tips extending (or encroaching) into the nearest pair of oxide portions 104, 106, 108, and 110 to form a continuous oxide region across the top of the wafer. Nitride regions 84, 86, 88, and 90 act as protective coverings to inhibit oxidation of the doped silicon at places apart from holes 74, 76, and 78.

As indicated in FIG. 3*m*, oxide region 124 enroaches laterally into oxide region 104 a distance (or width) W$_{OLG}$ from the place where right-hand edge 112 of oxide region 104 existed to a left-hand point 130 beyond which the thickness of oxide portion 104 is relatively constant. Oxide lateral growth distance W$_{OLG}$ may be measured empirically. In combination, oxide regions 104 and 124 form a composite insulation region having a maximum thickness at a point above P+ region 114 and a minimum thickness at a point above N region 66 with the thickness decreasing approximately from the vicinity of right-hand edge 112 to point 130.

The formation of oxide regions 124, 126, and 128 during the steam oxidation stem causes the ends of nitride regions 84, 86, 88, and 90 not previously bent upward to bend upward as shown in FIG. 1*m*. Each of nitride regions 84, 86, 88, and 90 is now generally in the shape of an upright saucer as viewed from the side. The top surfaces of nitride regions 84, 86, 88, and 90 oxidize during the steam oxidation step to form electrically insulating coverings 132, 134, 136, and 138, respectively, of silicon dioxide having a thickness of approximately 200 angstroms. The thickness of nitride regions 84, 86, 88, and 90 decreases slightly with the formation of oxide coverings 132, 134, 136, and 138.

A photoresist mask 140 is formed on the wafer as shown in FIG. 1*n*. Mask 140 has an open space extending from a point on the top surface of the left-hand section of oxide-isolation region 56 to a point near the middle of the top surface of insulation region 126, thereby covering the top surface of the wafer between the right-hand section of oxide region 56 and the middle of oxide region 126. Oxide coverings 132 and 134, which are exposed by this open space, are removed by etching with buffered hydrofluoric acid for 1 minute. This etching also decreases the thicknesses of the exposed portions of oxide regions 56, 124, and 126. Next, nitride regions 84 and 86 are removed by etching with boiling phosphoric acid for 45 minutes.

Figure 3O:
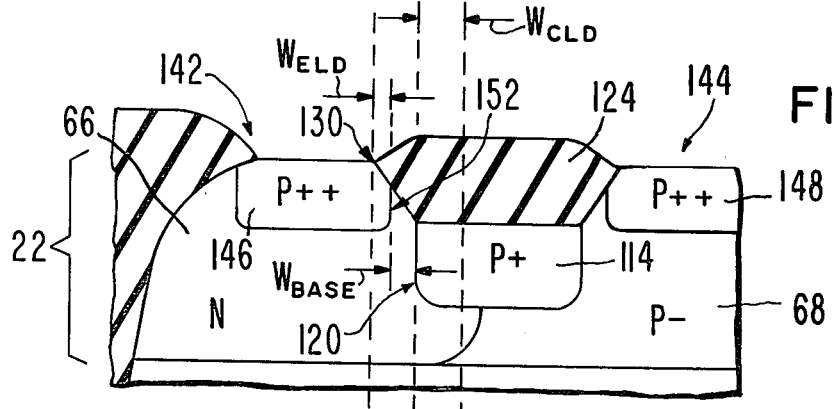

After removing mask 140, the silicone dioxide on the top surface of the wafer is etched with buffered hydrofluoric acid for 30 seconds to form open areas 142 and 144 as shown in FIG. 1*o* through oxide regions 104 and 106, respectively, thereby exposing sections of the upper surfaces of N region 66 and P− region 68, respectively. Oxide regions 124, 126, and 128 are also reduced in thickness. Preferably the top surface of the wafer is etched only for a time sufficient to remove oxide region 104 up to point 130 so that oxide region 124 has a well-defined left-hand edge at point 130 as shown in FIG. 3*o*. Alternatively, the top surface of the wafer may be etched rightward beyond point 130 but no closer than about 0.75–1.0 micron to left-hand boundary 120 of P+ region 114.

This etching removes oxide coverings 136 and 138 and further reduces the bird beak on oxide-isolation region 56. Nitride regions 88 and 90 protect oxide regions 108 and 110 from being etched by the buffered hydrofluoric acid.

A P-type dopant, boron from a BBr$_3$ source, is diffused at a temperature of 1,020° C. into portions of N region 66 and P− region 68 exposed by open areas 142 and 144, respectively, to form P++ regions 146 and 148, respectively. Alternatively, boron first is either predeposited on the upper surfaces of regions 66 and 68 or ion implanted to a shallow depth in regions 66 and 68 and then is diffused to create P++ regions 146 and 148, respectively. P++ regions 146 and 148 are each approximately 3,000 angstroms in depth (or thickness) and have a sheet resistance of approximately 30 ohms/square. P++ region 146 extends laterally under the left-hand section of oxide-isolation region 56 and under oxide region 124.

The lateral diffusion of P++ region 146 under oxide region 124 is represented as a distance (or width) W$_{ELD}$ from edge 130 to the right-hand boundary 152 of P++ region 146 as shown in FIG. 3*c*. Since edge 130 is well defined, lateral diffusion distance W$_{ELD}$ for P++ region 146 is accurately controlled by controlling the diffusion conditions.

P++ region 146 is the emitter for a lateral PNP transistor. P+ region 114 is a collector for this lateral PNP transistor. N region 66 excluding both its portions now of p-type conductivity and its portions now oxidized is the base for the lateral transistor. The base width W$_{BASE}$ of the lateral transistor is the minimum distance from left-hand boundary 120 of P+ region 114 to right-hand boundary 152 of P++ region 146.

Referring to FIGS. 3*l*, 3*m*, and 3*o*, base width W$_{BASE}$ is given by $$W_{BASE} = W_{ETBK} + W_{OLG} - W_{CLD} - W_{ELD} \qquad (4)$$

Oxide lateral growth distance $W_{OLG}$ and lateral diffusion distances $W_{CLD}$ and $W_{ELD}$ are functions of the heating/oxidation/diffusion conditions for creating oxide region 124 and P+ region 114 and the diffusion conditions for creating P++ regions 146. By holding these conditions constant, base width $W_{BASE}$ becomes a function of etchback distance $W_{ETBK}$ which, as indicated above, is substantially a linear function of etching time $t_{ET}$ at constant etchant temperature $T_{ET}$. Rate $R_{ET}$ at which distance $W_{ETBK}$ increases (i.e., oxide region 104 is etched back) is given above as described for FIG. 4 or may be independently measured. Accordingly, base width $W_{BASE}$ is controlled accurately by varying etching time $t_{ET}$ and etchant temperature $T_{ET}$ as desired.

The top surface of the wafer is exposed at a temperature of 1,000° C. to nitrogen and oxygen for 5 minutes, to steam for 20 minutes, and then to nitrogen for 5 minutes to grow electrically insulating region 154 of silicon dioxide between oxide regions 56 and 124 and to grow electrically insulating region 156 of silicon dioxide between oxide regions 124 and 126 as shown in FIG. 1p. The depth (or thickness) of oxide regions 154 and 156 is about 2,000 angstroms.

The thickness of oxide regions 124, 126, and 128 increases during this heat treatment as some of the silicon forming the top surfaces of P+ regions 114, 116, and 118, respectively, is consumed (oxidized). Oxide-isolation region 56 increases slightly in thickness. Electrically insulating coverings 158 and 160 form from the top surfaces of nitride regions 88 and 90, respectively, as they decrease slightly in thickness. The depth (or thickness) of oxide coverings 158 and 160 is about 50 angstroms.

During this heat treatment, the P-type impurity in P++ regions 146 and 148 moves (or is driven) further downward and sideward to create P++ regions 162 and 164, respectively. P++ regions 162 and 164 have a sheet resistance of about 70 ohms/square and are each approximately 5,000 angstroms in depth (or thickness). The P-type impurity in P+ regions 114, 116, and 118 also diffuses slightly further downward and sideward.

The top surface of the wafer is exposed for 10 seconds to buffered hydrofluoric acid to remove oxide coverings 158 and 160 overlying nitride regions 88 and 90. The thickness of oxide regions 56, 124, 126, 128, 154, and 156 decrease slightly. Nitride regions 88 and 90 are then removed by exposing them to boiling phosphoric acid for 45 minutes.

A photoresist mask 170 is formed on the top surface of the wafer as illustrated in FIG. 1q. Mask 170 has an opening extending from the middle of oxide region 126 to a point on the right-hand section of oxide-isolation region 56. The surface area exposed by the opening in mask 170 is etched with buffered hydrofluoric acid for 1 minute to form open areas 172 and 174 through oxide regions 108 and 110, respectively, thereby exposing sections of the upper surfaces of P− region 68 and N region 70, respectively. This etching also reduces the thicknesses of the exposed portions of oxide regions 126, 128, and 56.

After removing mask 170, a photoresist mask 176 is formed on the top surface of the wafer as shown in FIG. 1r. Mask 176 has an opening extending approximately between the middles of oxide regions 124 and 128. A P-type impurity, boron in form of B+, is implanted through the opening in mask 170 (and through oxide region 156) into P− region 68 at an energy of 200 kiloelectron volts at a dosage of $5 \times 10^{12}$ ion/centimeter$^2$ to form P++ region 178 generally between oxide regions 124 and 126 and P+ region 180 generally between oxide regions 126 and 128. P++ region 178 includes within it original P++ region 164. P++ region 178 still has a sheet resistance of about 70 ohms/square while P+ region 180 has a sheet resistance of about 4500 ohms/square. Oxide regions 124, 126, and 128 generally prevent the P-type impurity from being implanted into P+ regions 114, 116, and 118, respectively. However, the P-type impurity penetrates sufficiently through the side portions of oxide regions 124, 126, and 128 such that P++ region 178 extends from P+ region 114 to P+ region 116 and P+ region 180 extends from P+ region 116 to P+ region 118. That is, regions 114, 178, 116, 180, and 118 form a continuous P-type low-resistivity region.

Alternatively, the etching and implant steps described in the two preceding paragraphs may be reversed.

After removing mask 176, an N-type impurity, phosphorus from a PBr$_3$ source, is diffused at a temperature of 960° C. into portions of P+ region 180 and N region 70 exposed by openings 172 and 174, respectively, to form N+ regions 182 and 184, respectively, as shown in FIG. 1s. N+ regions 182 and 184 are each approximately 4000 angstroms in thickness and have a sheet resistance of about 25 ohms/square. Although this diffusion acts to repair lattice damage caused by the P-type implant used in forming P-type regions 178 and 180, a separate annealing step may be performed before or after this diffusion to enhance the repair of lattice damage.

N+ region 182 is the emitter for a vertical NPN transistor. P+ region 180 in combination with P− region 68, but excluding both N+ region 182 and the oxidized portions, is the base for this vertical ransistor. N+ region 20 is a collector for the vertical NPN transistor.

While the emitter for the PNP lateral transistor originally comprised P++ region 146 as described above for FIG. 1o, P++ region 146 has expanded sideward and downward by diffusion to become P++ region 162 during subsequent high-temperature steps (and particularly during the step described for FIG. 1p). Similarly, P+ region 114 has expanded slightly sideward and downward during high-temperature steps subsequent to the step shown in FIG. 1o. As depicted in FIG. 1s, P++ region 162 now comprises the emitter for a lateral PNP transistor; slightly expanded P+ region 114 comprises the collector for this lateral transistor; N region 66 excluding both its portions now of P-type conductivity and its portions now oxidized comprises the base for the lateral transistor.

Figure 3S:
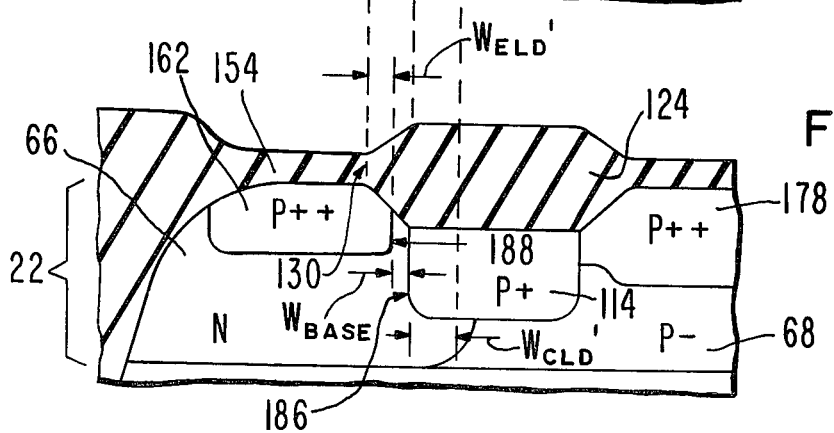

Base width $W_{BASE}$ for the lateral transistor of FIG. 1s is slightly different than that of the original lateral transistor illustrated in FIG. 1o. As shown in FIGS. 3l and 3s, the lateral diffusion of P+ region 114 toward P++ region 162 is represented as distance $W_{CLD}'$ from original left-hand boundary 100 of P+ region 94 to the present left-hand boundary 186 of P+ region 114; the lateral diffusion of P++ region 162 under oxide region 124 is represented as a distance $W_{ELD}'$ from edge 130 to the right-hand boundary 188 of P++ region 162. Referring also to FIG. 3m, base width $W_{BASE}$ is now given by $$W_{BASE} = W_{ETBK} + W_{OLG} - W_{CLD}' - W_{ELD}' \qquad (5)$$

The increases in diffusion distances W$_{CLD}$' and W$_{ELD}$' over diffusion distances W$_{CLD}$ and W$_{ELD}$, respectively, are functions of the diffusion conditions for the high-temperature steps subsequent to the step depicted in FIG. 1n. By holding these subsequent diffusion conditions constant, base width W$_{BASE}$ again becomes a function of etchback distance W$_{ETBK}$ and therefore substantially a linear function of etching time t$_{ET}$ at constant etchant temperature T$_{ET}$ for the present lateral transistor.

Electrical contacts are next formed on the wafer for the various components of the lateral and vertical transistors. A photoresist mask 190 having a pair of openings above P+ + regions 162 and 178 is formed on the wafer as shown in FIG. 1t. Holes 192 and 194 are etched through oxide regions 154 and 156, respectively, down to P+ + regions 162 and 178, respectively, by exposing oxide regions 154 and 156 through the openings in mask 190 to buffered hydrofluoric acid for a calculated etching time of at least 30 seconds. The etching time is determinable from experimental results and must not be great enough to expose any N-type conductivity part of N region 66. Alternatively, a mask with an opening extending from a point above the left-hand section of oxide-isolation region 56 to a point above oxide region 126 can be used in forming contact windows to P+ + regions 162 and 178. In this case, the etching with buffered hydrofluoric acid also removes parts of the exposed surfaces of oxide regions 56, 124, and 126 in addition to forming contact windows analagous to holes 192 and 194. When using this alternative, care must be exercised not to overetch and expose N region 66 at its surface.

After removing mask 190, an electrically conductive layer 196 of aluminum with about 2 percent silicon and 4 percent copper is deposited as shown in FIG. 1u on the top surface of the wafer and into openings 192, 194, 172, and 174 according to conventional techniques. The thickness of conductive layer 196 is about 7,000–8,000 angstroms. The silicon in conductive layer 196 acts to prevent silicon diffusion into the aluminum and a corresponding penetration of the aluminum into the silicon (often termed "aluminum spiking") which would cause shorts at the emitter-base junctions of both the lateral and vertical transistors. The copper inhibits electron migration at high current densities. A photoresist mask 198 is formed on the top surface of conductive layer 196. Mask 198 has selected openings generally above one or more of oxide regions 56, 124, 126, and 128. The portions of conductive layer 196 exposed through mask 198 are according to conventional techniques.

The resulting structure is, for example, that illustrated in FIG. 1v. The remaining portions of conductive layer 196 are regions 200, 202, 204, and 206 which make electrical contact with P+ + regions 162 and 178 and N+ regions 182 and 184, respectively. Region 200 is the emitter contact for the lateral PNP transistor. Region 202 is the collector contact through P+ + region 178 for the lateral transistor. Region 206 is the base contact through N-type regions 184, 70, and 20 for the lateral transistor. Likewise, for the vertical NPN transistor, region 204 is the emitter contact; region 206 is the collector contact through N-type regions 184 and 70; region 202 is the base contact through P-type regions 178 and 116 for the vertical transistor.

The impurities (both N-type and P-type) employed in forming the base for the lateral PNP transistor have been introduced into the wafer in a direction generally orthogonal to the plane of the wafer. The horizontal impurity variations for the B+ implant to form P− region 28 (as shown in FIG. 1o) and the P+ + implant to form N region 34 (as illustrated in FIG. 1d) are normally 2 percent or less. The horizontal impurity variation in the base of the lateral transistor is reduced substantially to zero during the subsequent high-temperature steps through lateral impurity diffusion. At the silicon/silicon-dioxide interface 208 between oxide region 124 and N region 66 as shown in FIG. 1v, some impurity does pile up during the growth of oxide region 124. Accordingly, except for the small impurity build up at interface 208, there is substantially no impurity variation in the narrow portion of N region 66 serving to define base width W$_{BASE}$ in a direction parallel to the plane of the wafer.

Furthermore, the vertical impurity variation in the base of the PNP lateral transistor is reduced to about $1 \times 10^{21}$ ions/centimeter$^4$ during the high-temperature steps when the impurities diffuse upward and downward to define N region 66. Consequently, the PNP base has very little impurity variation in any direction.

Referring again to FIGS. 1j–1s, 3l, 3m, 3o and 3s, only a single masking edge 82 is utilized in defining emitter region 146 or 162 and collector region 114, and therefore base width W$_{BASE}$, for the lateral transistor. It is therefore self-aligning with masking edge 82.

Base width W$_{BASE}$ is controllable to 0.5 micron or less regardless of lithographic design rules. The amplification gain for the lateral transistor of the invention is typically 2–5 with a transit time less than 1 nanosecond.

Whereas the collector for the lateral PNP transistor has been described as comprising P+ region 114, the collector may be viewed as further including P+ + region 178. Likewise, the base for the lateral transistor may be viewed as further including the N-type conductivity portions of region 20, or regions 20 and 70, or regions 20, 70, and 184. In some applications, the emitter and collector of the lateral transistor may be interchanged.

Similar considerations hold for the vertical NPN transistor. Its base may be viewed as further including various combinations of P-type regions 178, 116, and 118. Its collector may be viewed as further including the N-type conductivity portion of region 70 (including region 184). The emitter and collector for the vertical transistor may likewise be interchanged in some applications.

In lieu of doping a P-type layer (such as epitaxial layer 22) with an N-type impurity to create an N-type region (such as N region 34) which later becomes the base for the lateral PNP transistor and then introducing P-type impurities to define the emitter and collector, the lateral PNP transistor could alternatively be created by employing an N-type substrate or an N-type epitaxial layer which later becomes the base for a lateral PNP transistor and then following the steps illustrated for FIGS. 1j–1o to define the emitter and collector. Furthermore, the steps described above may be utilized in forming other types of devices that have a three-region PNP configuration as in the lateral PNP transistor.

Semiconductor materials of the opposite conductivity type to those described above may be employed to accomplish the same results. That is, the foregoing steps may be followed in creating a lateral NPN transistor or other device having a corresponding three-region NPN configuration.

Other types of chemical etchants which substantially do not attack silicon and silicon nitride may be used in lieu of buffered hydrofluoric acid for etching silicon dioxide in one or mre of the foregoing steps. Additionally, plasma etching techniques may alternatively be employed for most etching steps.

While the invention has been described with reference to particular embodiments, the description is solely for the purpose of illustration and is not to be construed as limiting the scope of the invention claimed below. For example, other isolation techniques such as conventional planar techniques may be used in lieu of the isoplanar oxide-isolation techniques. Thus, various modifications, changes, and applications may be made by those skilled in the art without departing from the true scope and spirit of the invention as defined by the appended claims.

What is claimed is:

1. A method for manufacturing bipolar a transistor having a base, an emitter, and a collector comprising the steps of:
providing a body of semiconductor material having an impurity region of a first conductivity type therein adjacent to an electrically insulating layer along an upper surface of the body;
forming a protective layer over the insulating layer;
forming an open space through the protective layer above a first region in the body intended for a first doped region of a second conductivity type opposite to the first conductivity type, at least a portion of the first region being coincident with a portion of the impurity region, the open space defining an edge of the remainder of the protective layer nearest to a second region in the body spaced apart from the first region and intended for a second doped region of the second conductivity type, at least a portion of the second region being coincident with a portion of the impurity region;
introducing a first semiconductor dopant of the second conductivity type through the open space into the body to form the first doped region;
etching the insulating layer through the open space back under the remainder of the protective layer laterally at least toward the second region to define an open space through the insulating layer;
oxidizing adjacent portions, along the insulating layer, of the first doped region and the impurity region outside the first doped region to create an electrically insulating region which includes therein the insulating layer, thereby to leave a remaining impurity region comprising the non-oxidized portion of the impurity region still of the first conductivity type and likewise to leave a remaining first doped region comprising the non-oxidized portion of the first doped region, the insulating region having a minimum thickness at a point above the second region;
removing at least a portion of the remainder of the protective layer above the second region;
forming an open space through the insulating region above the second region; and
introducing a second semiconductor dopant of the second conductivity type through the open space in the insulating region into the body to form the second doped region;
whereby the base comprises the remaining impurity region excluding the second doped region, the emitter comprises one of the second doped region and the remaining first doped region, and the collector comprises the other of the second doped region and the remaining first doped region.

2. A method as in claim 1 wherein the step of providing comprises introducing a semiconductor impurity of the first conductivity type into the body at a direction generally orthogonal to a plane tangent to the upper surface to form the impurity region.

3. A method as in claim 2 wherein the step of providing further includes oxidizing a portion of the body along all of the upper surface to form the insulating layer.

4. A method as in claim 1 wherein the step of etching includes etching the insulating layer through the open space down to semiconductor material of the body.

5. A method as in claim 1 and further including, before the step of introducing a first semiconductor dopant, the step of etching the insulating layer through the open space down to semiconductor material of the body.

6. A method as in claim 1 wherein the step of introducing a first semiconductor dopant comprises ion implanting the first dopant using the edge of the remainder of the protective layer to control the lateral extent of the first doped region toward the second region, the remainder of the protective layer substantially preventing the first dopant from being ion implanted elsewhere into the body.

7. A method as in claim 6 and further including the step of diffusing the first dopant in the body laterally toward the second region to define the first doped region.

8. A method as in claim 1 wherein the remainder of the protective layer substantially prevents the insulating layer from being etched elsewhere during the step of etching.

9. A method as in claim 8 wherein the open space in the protective layer is generally vertically aligned with and larger in cross-section than the open space in the insulating layer.

10. A method as in claim 1 wherein the step of oxidizing comprises exposing the adjacent portions through the aperture and the hole to a selected oxidizing environment, the remainder of the protective layer substantially preventing the remaining impurity region from being oxidized.

11. A method as in claim 10 wherein the step of removing comprises removing the entire remainder of the protective layer.

12. A method as in claim 1, 4, 5, 10, or 11 wherein the step of forming an open space through the insulating region comprises etching it for a sufficient time to create the open space through it without etching through it anywhere else, thereby defining an edge of the remainder of the insulating region nearest to the remaining first doped region.

13. A method as in claim 12 wherein the lateral distance between the edges of the remainders of the protective layer and the insulating region are controlled by the distance that the insulating layer is etched laterally toward the second region during the step of etching.

14. A method as in claim 13 wherein the step of introducing a second semiconductor dopant comprises diffusing the second dopant into the second region using the edge of the remainder of the insulating region to control the lateral extent of the second doped region toward the remaining first doped region.

15. A method as in claim 4, 5, 6, 8, or 10 wherein the protective layer is silicon nitride.

16. A method as in claim 15 wherein the first dopant is singly ionized boron.

17. A method as in claim 1, 4, 5, 6, or 10 wherein the first conductivity type is N type and the second conductivity type is P type.

18. A method as in claim 1, 4, 5, 6, or 10 wherein the first conductivity type is P type and the second conductivity type is N type.

19. A method for forming a pair of regions of a selected conductivity type spaced apart from each other in a body of semiconductor material containing a semiconductor region therein adjacent to an electrically insulating layer along an upper surface of the body, the method comprising the steps of:

depositing a protective layer on the insulating layer;

forming an open space through the protective layer above a first region in the body intended for a first doped region of the selected conductivity type so as to define a right-hand edge of the remainder of the protective layer, at least a portion of the first region being coincident with a portion of the semiconductor region, a second region in the body intended for a second doped region of the second conductivity type being located laterally to the left of the first region, and at least a portion of the second region being coincident with a portion of the semiconductor region;

introducing a first semiconductor dopant of the second conductivity type through the open space into the body;

etching the insulating layer through the open space back under the remainder of the protective layer a selected lateral distance from the right-hand edge leftward toward the second region;

simultaneously diffusing the first dopant downward and sideward to form the first doped region and oxidizing adjacent portions, along the upper surface, of the first doped region and the semiconductor region outside the first doped region to define an electrically insulating region including the insulating layer therein, thereby to leave a remaining first doped region comprising the non-oxidized portion of the first doped region, the remaining first doped region having a left-hand boundary determinable from the right-hand edge and the insulating region having a minimum thickness at a point above the second region;

removing at least a portion of the remainder of the protective layer above the second region;

etching the insulating region for a sufficient time to form an open space therethrough so as to define a left-hand edge of the remainder of the insulating region determinable from the selected lateral distance;

introducing a second semiconductor dopant of the selected conductivity type through the open space in the insulating region into the body to form the second doped region, the second doped region having a right-hand boundary determinable from the left-hand edge and spaced apart to the left of the left-hand boundary.

20. A method as in claim 19 wherein the protective layer comprises silicon nitride and the step of etching is performed with a chemical etchant that substantially does not attack silicon nitride.

* * * * *